United States Patent
Boudoux et al.

(10) Patent No.: US 11,362,537 B2
(45) Date of Patent: Jun. 14, 2022

(54) BACKUP POWER SUPPLY SYSTEM

(71) Applicant: APTIV TECHNOLOGIES LIMITED, St. Michael (BB)

(72) Inventors: Emmanuel Boudoux, Cologne (DE); Victor Oliveira Tolentino, Wuppertal (DE); Jörg Wallerath, Essen (DE)

(73) Assignee: APTIV TECHNOLOGIES LIMITED, St. Michael (BB)

( * ) Notice: Subject to any disclaimer, the term of this patent is extended or adjusted under 35 U.S.C. 154(b) by 29 days.

(21) Appl. No.: 17/001,744

(22) Filed: Aug. 25, 2020

(65) Prior Publication Data
US 2021/0075249 A1 Mar. 11, 2021

(30) Foreign Application Priority Data
Sep. 9, 2019 (EP) .................................. 19196244

(51) Int. Cl.
| H02J 9/06 | (2006.01) |
| H02J 7/00 | (2006.01) |
| H02J 7/34 | (2006.01) |
| B60R 16/033 | (2006.01) |
| H03K 3/037 | (2006.01) |

(52) U.S. Cl.
CPC .............. *H02J 9/06* (2013.01); *H02J 7/0014* (2013.01); *H02J 7/345* (2013.01); *B60R 16/033* (2013.01); *H02J 2207/50* (2020.01); *H03K 3/037* (2013.01)

(58) Field of Classification Search
CPC .. H02J 9/06; H02J 7/0014; H02J 7/345; H02J 2207/50; B60R 16/033; H03K 3/037
USPC .................................................. 307/10.1, 66
See application file for complete search history.

(56) References Cited

U.S. PATENT DOCUMENTS

| 2005/0077879 A1* | 4/2005 | Near ...................... H02J 7/0018 320/166 |
| 2008/0135357 A1 | 6/2008 | Lang |
| 2012/0013194 A1 | 1/2012 | Yamanoue |
| 2017/0099007 A1* | 4/2017 | Oates .................. H02M 7/5388 |
| 2018/0076644 A1* | 3/2018 | Qureshi .................. H02J 7/345 |

(Continued)

FOREIGN PATENT DOCUMENTS

JP 2010154628 A 7/2010

OTHER PUBLICATIONS

Takashi JP 2010154628 Machine Translation (Year: 2010).*

(Continued)

*Primary Examiner* — Michael R. Fin
(74) *Attorney, Agent, or Firm* — Carlson, Gaskey & Olds, P.C.

(57) ABSTRACT

A balancing system for balancing respective voltages of N consecutively connected capacitors during charging or discharging includes balancing units, each having a pair of associated switches and an electromagnetic coil. An inter-switch junction is connected to an inter-capacitor junction of a corresponding group of capacitors through the electromagnetic coil. A control and generation circuit generates PWM control signals and transmits a generated PWM control signal to each of the switches. The PWM control signals have fixed duty cycles that do not vary temporarily during charging or discharging of the N capacitors. The duty cycles of two PWM control signals transmitted to two associated switches are complementary for each balancing unit.

12 Claims, 9 Drawing Sheets

(56) References Cited

U.S. PATENT DOCUMENTS

2020/0207219 A1* 7/2020 Slepchenkov ......... B60K 17/34

OTHER PUBLICATIONS

Partial European Search Report for Application No. EP19196244.8 dated Nov. 25, 2019.
Extended European Search Report for Application No. 19196244.8 dated Mar. 6, 2020.

* cited by examiner

BACKUP POWER SUPPLY SYSTEM

CROSS REFERENCE TO RELATED APPLICATION

This application claims priority to European Patent Application No. EP 19196244.8, filed on 9 Sep. 2019.

TECHNICAL FIELD

The present disclosure relates to the field of power supply systems and more precisely to backup power supply systems. Such a system can be used, for example, in a vehicle to provide power to an on-board electrical circuit in case an on-board battery is momentarily interrupted.

BACKGROUND

In a vehicle, an electrical battery (typically a battery of 12V) is provided on board to supply power to electrical devices of the vehicle. Under certain circumstances, the power supply from the battery may be temporary interrupted, typically during a time interval from several milliseconds to several seconds, due to an undesired disconnection of the battery. In such a situation, it is needed to supply power to the electrical devices of the vehicle from a backup power supply system. Capacitors are usually used as energy buffers in such a backup power supply system.

FIG. 11 shows schematically a source power, such as a battery bat having a voltage V_bat that supplies a load P with an electric current i(t). A plurality of serially connected capacitors C are connected in parallel to the load P and acts as an energy buffer. When the connection of the load P with the power source bat is interrupted, as represented schematically when the switch SW is open (off), the battery supply is interrupted and the capacitors C supply current i(t) to the load P.

In a vehicle, devices such as ADAS (Advanced Driver Assistant System) controllers require such backup power supply.

In order to face a disconnection of the battery lasting up to several seconds, it is needed to store a high amount of energy. For this purpose, it is known to use specific capacitors, called supercapacitors (or ultracapacitors). A supercapacitor is a high-capacity capacitor with a capacitance value much higher than other capacitors, but with lower voltage limits. The maximum charge of a supercapacitor is for example around 2.5 V. Charging a supercapacitor beyond its maximal charge may cause damage. Consequently, in order to provide a backup power supply with a desired high voltage (superior to the voltage limit imposed by the capacitor), it is necessary to connect a plurality of capacitors in series. In a vehicle having a 12V battery, six or seven capacitors serially connected are needed to achieve the backup power supply.

The capacitance values of manufactured capacitors having a same maximum charge are usually very dispersed. Typically, variations of about 20% to 30% can be observed.

It results from the above that, when a stack of capacitors, including N capacitors serially connected, is charged from a power source, it is needed to balance the voltages of the different capacitors in order to avoid that one or more capacitors be charged above its maximum charge.

Different techniques are known to balance the voltages of the capacitors of a stack of capacitors.

With reference to FIG. 12, a first technique uses a resistance R half-bridge to balance the voltages of at least two capacitors C1, C2 serially connected. The higher is the resistance value, the longer is the charging time period. With capacitors having capacitance values of around the kilofarad and resistances R having resistive values around 10 kΩ, the time constant of the capacitors is around megaseconds and consequently the charging time is very long. In practice, such a solution is not interesting.

With reference to FIG. 13, a second technique, that is a variant of the first technique, is based on a circuit having also a resistance R half-bridge connected to at least two serially connected capacitors C1, C2, wherein the inter-resistance junction is connected to the inter-capacitor junction through an amplifier R and a damping resistor r, serially connected. Such a balancing circuit allows a rather quick balancing but produces a lot of heat.

Linear Technology Corporation designs and manufactures high current supercapacitor charger and backup supply, such as the products referenced LTC3350 and LTC3625. Such products provide an automatic balancing of the capacitors but have two main drawbacks. These products are expensive and the automatic balancing requires several minutes to achieve the balancing.

In the automotive environment, a maximum balancing time of a few seconds is desired.

With reference to FIG. 14, a third technique uses a switched power supply (or switching mode regulator) with a feedback (or regulation) loop. As represented in FIG. 14, in order to charge for example two capacitors C1, C2 serially connected, two serially connected switches SW1, SW2 are connected in parallel to the two capacitors C1, C2 and the inter-switch junction and the inter-capacitor junction are connected through an electromagnetic coil L. The two switches SW1, SW2 and the two capacitors C1, C2 are connected to a power source, providing a voltage u_total and a current i_charge, in order to charge the capacitors C1, C2. A controller CT produces PWM control signals, PWM1 and PWM2, to control the switches SW1 and SW2, respectively, in such a way that the capacitor voltages u_C1 and u_C2 are balanced. In addition, the voltage of the capacitors is measured and transmitted to the controller CT as a feedback signal V_fb (voltage signal at the inter-capacitor junction). The controller CT modulates, or regulates, the duty cycles of the PWM control signals PWM1 and PWM2 transmitted to the two switches SW1 and SW2, depending on the feedback signal, in order to balance the capacitor voltages u_C1 and u_C2. Such a switched power supply system with a feedback loop offers a fast and efficient balancing. However, it has a major drawback of being expensive.

It is needed to improve the situation. More precisely, it is needed to provide a cheaper alternative backup power supply system that achieves a fast and efficient balancing of serially connected capacitors.

SUMMARY

The present disclosure concerns a balancing system for balancing respective voltages of N consecutively connected capacitors of a backup power supply system during charging or discharging of said N capacitors, n groups of at least two consecutive capacitors, with n≤N−1, being defined from the N capacitors. The balancing system includes a plurality of n balancing units for the n groups of capacitors, respectively. Each balancing unit includes a pair of associated switches connected through an inter-switch junction and an electromagnetic coil. The inter-switch junction is connected to an inter-capacitor junction of the corresponding group of capacitors through the electromagnetic coil. A control and generation circuit generates PWM control signals and transmits a generated PWM control signal to each of the switches. The control and generation circuit is configured to generate the PWM control signals with fixed duty cycles that do not vary temporarily during charging or discharging of the N capacitors. The duty cycles of two of the PWM control signals to be transmitted to two associated switches are complementary for each balancing unit.

In the present disclosure, for each or some of the inter-capacitor junctions (or nodes), a balancing circuit having a pair of connected switches is connected to the inter-capacitor junction through a coil, schematically in the form of a half H-bridge. The various capacitance values of the capacitors cause that the charges in the different capacitors increase differently. Consequently, the imbalance between capacitor voltages generates balancing currents through the coils, that contribute to balance the capacitor voltages. According to the present disclosure, the two switches are controlled by fixed duty cycles that do not vary temporarily during charging or discharging of the N capacitors. In other words, the two switches are turned on/off at fixed duty ratios during charging or discharging (that do not vary temporarily during charging or discharging).

The present disclosure also concerns a backup power supply system including a stack of N capacitors consecutively connected and a balancing system as above defined for balancing the respective voltages of the N capacitors during charging or discharging said N capacitors.

In an example embodiment, the stack of N capacitors consecutively connected has two terminals and each pair of associated switches is connected to said terminals of the stack of N capacitors.

In an example embodiment, the capacitors are supercapacitors.

In a particular embodiment, each pair of connected switches are connected to the N capacitors.

In an example embodiment, the N capacitors having respective indices i from 1 to N, for each balancing unit having an inter-capacitor junction between two capacitors of respective indices i and i+1 connected to the inter-switch junction, the control and generation circuit is configured to generate a first PWM control signal having a duty cycle equal to (N−i)/N and a second PWM control signal having a duty cycle equal to i/N.

In another particular embodiment, for each balancing unit, the pair of associated switches is connected to two terminals of the corresponding group of capacitors.

In an example embodiment, the control and generation circuit is configured to generate PWM control signals that all have a duty cycle of 50%.

Such a control and generation circuit is simpler.

In a particular embodiment, each group of capacitors includes only two capacitors.

In an example embodiment, the control and generation circuit includes a flip-flop based frequency divider.

In an example embodiment, the control and generation circuit is configured to be connected to a power source and be provided with a clock signal from the said power source.

In an example embodiment, the control and generation circuit includes at least one flip-flop and logical gates.

In an example embodiment, the control and generation circuit includes a number of n flip-flops, wherein n is determined from the number N of capacitors according to the relation $2^{n-1} < N \leq 2^n$.

In an example embodiment, the system further comprises a power source that is configured to:

produce a fixed charge current, during a first charging phase; and during a second charging phase, after the voltage of the stack of capacitors consecutively connected has reached a predetermined target value, produce a charge current modulated to maintain the voltage of the plurality of capacitors in series at the predetermined target value.

Said system may be integrated in a vehicle and supply power to an electrical circuit of the vehicle and the power source includes an electrical battery of the vehicle.

In an example embodiment, the N capacitors are arranged to supply power to an electrical circuit of a vehicle when an electrical battery of the vehicle is temporary disconnected from the electrical circuit.

The present disclosure also concerns a vehicle comprising the backup power supply system as previously defined, said backup power supply system being configured to be charged from a power source comprising an electrical battery of the vehicle and to supply power to an electrical circuit of the vehicle.

BRIEF DESCRIPTION OF THE DRAWINGS

Other features, purposes and advantages of the disclosure will become more explicit by means of reading the detailed statement of the non-restrictive embodiments made with reference to the accompanying drawings.

DETAILED DESCRIPTION

Figure 1:
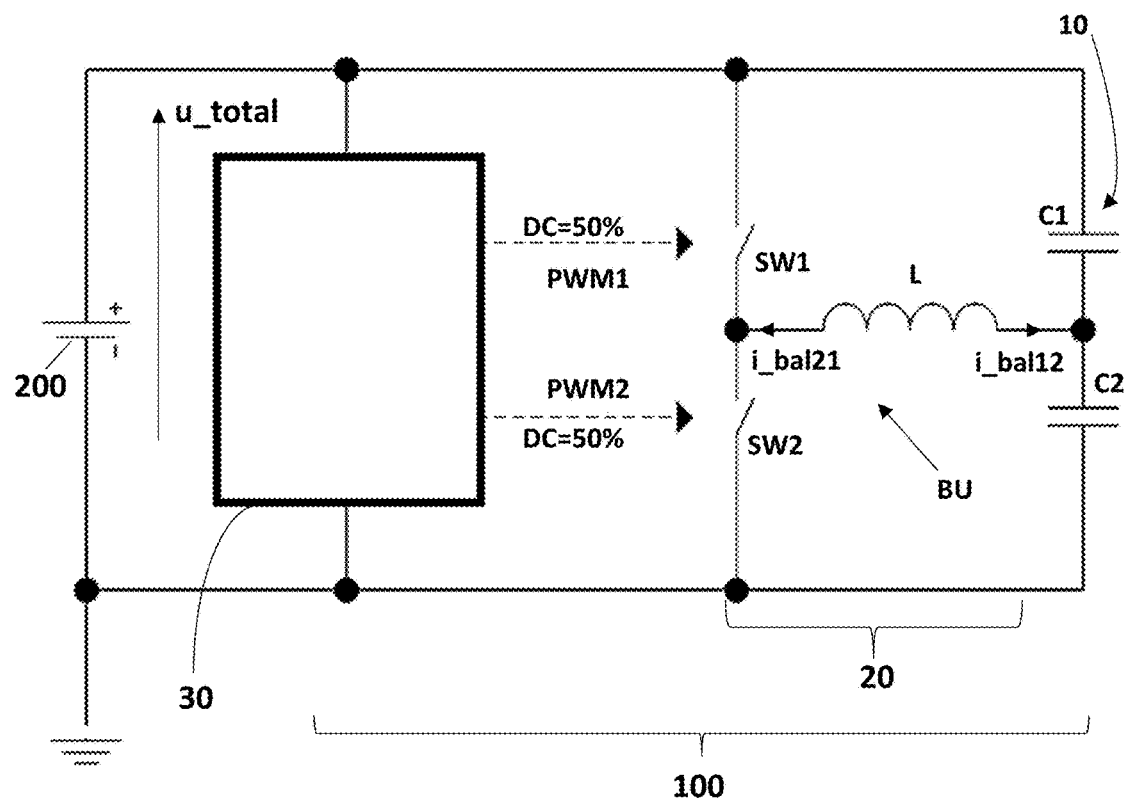
FIG. 1 shows a schematic and simplified representation of a first exemplary embodiment of the backup power supply system having two capacitors and a pair of associated switches.

Beforehand, it is stated that the same, analogous or corresponding elements represented on different figures have the same reference, unless otherwise stated.

The present disclosure concerns a backup power supply system 100 that can be used, for example in a vehicle, as an energy reserve available to be used when it is needed, for example when a battery power supply is interrupted due to a disconnection of the battery. The backup power supply system 100 is charged from a power source 200, for example an electrical battery (typically a 12V battery) in a vehicle. When the battery power supply is interrupted, the backup power supply is discharged in order to supply current to one or more loads, that are electrical devices of the vehicle.

The backup power supply system 100 has
a set or stack 10 of N capacitors C1, C2, ..., Ci, ..., CN that are serially connected and
a balancing circuit 20 for balancing the respective voltages of the N capacitors during charging or discharging of the N capacitors.

In an example embodiment, the capacitors C1, C2, ..., Ci, ..., CN are supercapacitors.

A number of n groups of at least two consecutive capacitors, with n≤N−1, are defined from the N capacitors 10. Conventionally, an index j designates the index of a group of at least two capacitors with 1≤j≤n in the present description.

For each group of capacitors of index j, the balancing circuit 20 has a pair of associated and serially connected switches. The pairs of associated switches are referenced as SWj1 and SWj2 with 1≤j≤n (namely SW11, SW12, ..., SWj1, SWj2, ..., SWn1, SWn2) in the figures. An inter-switch junction, or node, related to each pair of associated switches (that is the junction or node between the two switches) is connected to an inter-capacitor junction, or node, related to said group of capacitors (that is a junction or node between two capacitors of the same group) through an electromagnetic coil L1, ..., Lj, ..., Ln. The group including:
one group of index j having at least two capacitors,
the corresponding pair of associated switches SWj1 and SWj2 and
the corresponding electromagnetic coil Lj
form a balancing unit named BUj in the description.

The backup power supply system 100 also includes a control and generation circuit 30 for generating PWM (Pulse Width Modulation) control signals PWMj1, PWMj2 and transmitting a generated PWM control signal PWMj1, PWMj2 to each of the switches SWj1, SWj2, with 1≤j≤n, in order to control the switches. In the present disclosure, the control and generation circuit generates PWM control signals PWMj1, PWMj2 having fixed duty cycles.

The expression "fixed duty cycles" means that the respective duty cycles do not vary temporarily during charging or discharging of the N capacitors. In other words, the duty cycles of the control signals used to turn on/off the switches are constant over time during charging or discharging.

For each balancing unit BUj, the two generated PWM control signal PWMj1, PWMj2 are complementary (PWMj1=$\overline{PWMj2}$), which means that the first signal PWMj1 is ON (or high level) when the second signal PWMj2 is OFF (or low level). So, the sum of the fixed duty cycles DC of the two PWM control signals PWMj1 and PWMj2 (respectively transmitted to two associated switches SWj1 and SWj2 with 1≤j≤n) is equal to 100%.

The backup power supply system 100 operates the switches according to a switching frequency $f_{sw}$. For example, the backup power supply system 100 uses a clock signal from the power source 200 (for example a power DCDC converter) as a basis frequency $f_b$ to control the switches. For a stack of N capacitors, the switching frequency $f_{sw}$ is equal to the basis frequency $f_b$ divided by N: $f_{sw}=f_b/N$. This configuration provides the advantage that there is no need to generate a frequency. As a result, the amount of resources or components can be reduced. Alternatively, an external basis frequency generator can be used. In that case, the frequency is advantageously determined according to a desired switching frequency for balancing the capacitors: $f_b=f_{sw}\cdot N$.

When the capacitors are being charged, they are connected to a power source 200. More precisely, the two terminals of the stack of N serially connected capacitors are connected to the two terminals of the power source 200. Conventionally, the capacitor of index 1 is connected to the positive terminal of the power source 200 and the capacitor of index N is connected to the negative terminal of the power source 200 (for example connected to the ground). The references u_total and i_charge designate the voltage and the electrical current provided by the power source 200. When the capacitors are used to supply one or more loads, the connection with the power source 200 is interrupted and the stack of N serially connected capacitors is connected to the load(s).

During charging (or discharging) of the N stacked capacitors, for each balancing unit BUj balancing a group of capacitors, an imbalance between the respective capacitor voltages of the different capacitors within the group causes an electrical current i_bal through the coil Lj. This electrical current i_bal allows to balance the capacitor voltages. The basic principle is that the capacitor having the highest voltage discharges into the capacitor having the smallest voltage (in case the group has two capacitors).

We first assume that the N serially connected capacitors are grouped by two and two adjacent groups of two capacitors have one middle capacitor in common. It means that N−1 groups of two consecutive connectors are defined.

FIG. 1 shows a schematic representation of the backup power supply system 100 according to a first exemplary embodiment that is very simplified. In this simplified embodiment, the backup power supply system 100 has only one balancing unit BU. More precisely, the backup power supply system 100 has only two capacitors C1, C2 and a pair of two associated switches SW1, SW2, connected to one another through a interswitch junction. The two switches SW1 and SW2 are connected "in parallel" to the two capacitors C1, C2 (i.e., the two terminals of the pair of switches SW1, SW2 are respectively connected to the two terminals of the stack of capacitors C1, C2), but the inter-capacitor junction between the two capacitors C1 and C2 and the inter-switch junction between the two switches SW1, SW2 are connected through a coil L. The backup power supply system 100 has also a control and generation circuit 30 that generates two PWM control signals PWM1 and PWM2 and transmits them to the two switches SW1 and SW2, respectively, in order to control them. The respective duty cycles DC of these two PWM control signals PWM1 and PWM2 are fixed and both equal to 50%. In order to charge the two capacitors C1 and C2, the balancing unit BU is connected to a power source 200, as represented in FIG. 1 (the BU is connected to the terminals of the power source 200). The control and generation circuit 30 can also be connected to the power source 200 and supplied by it.

During the operation of charging the capacitors C1, C2 through the balancing circuit 20, the capacitor voltages converge to the same value of u_total/2, u_total being the voltage of the power source 200, within a short period of time, inferior to one second, as will be explained in more detail later in the description. In FIG. 1, the reference i_bal12 represents the current through the coil when the top capacitor C1 discharges into the bottom capacitor C2, and the reference i_bal21 represents the current through the coil when the top capacitor C2 discharges into the bottom capacitor C1.

Figure 2:
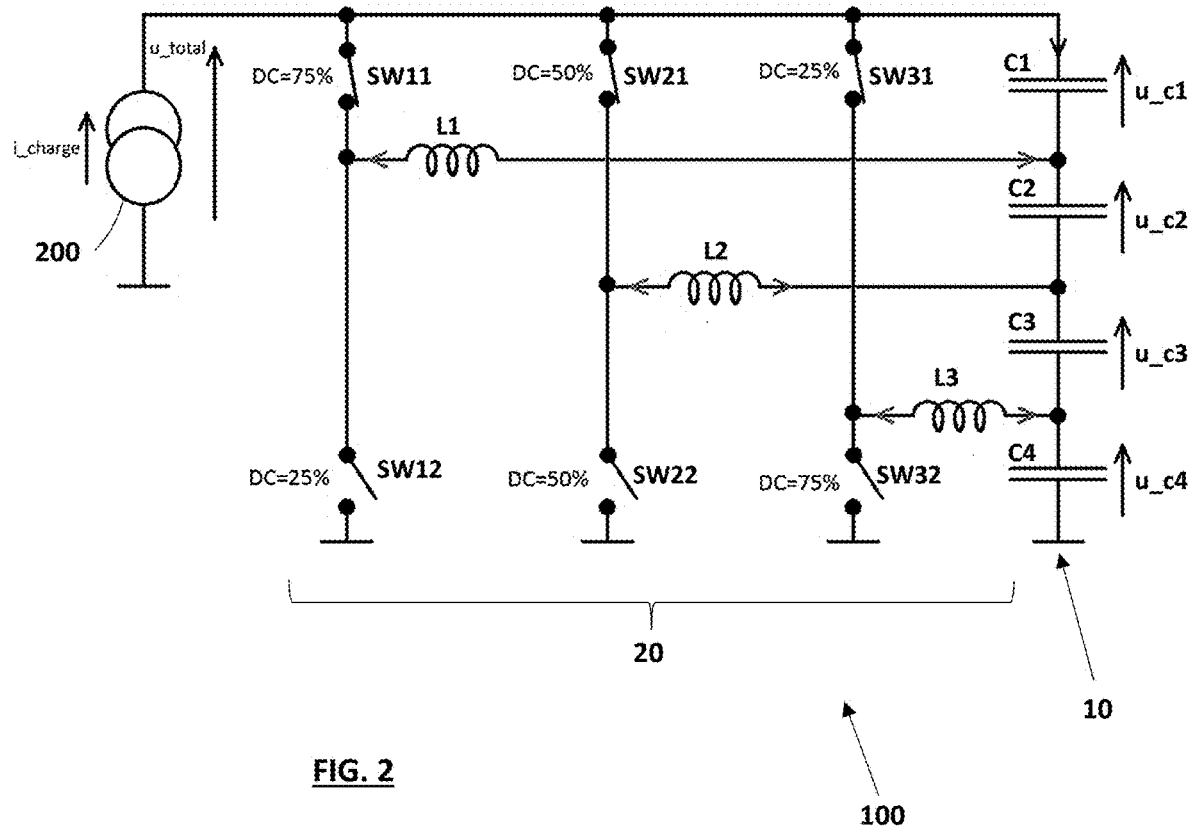
FIG. 2 shows schematically a second exemplary embodiment of the backup power supply system, having four capacitors and three pairs of associated switches.

FIG. 2 shows a schematic representation of the backup power supply system 100 according to a second exemplary embodiment.

In the second exemplary embodiment, the backup power supply system 100 has a stack of four capacitors C1, C2, C3 and C4 (N=4), serially (i.e., consecutively) connected, and three pairs of associated switches SW11-SW12, SW21-SW22, SW31-SW32. Each pair of switches SW11-SW12 (SW21-SW22 and SW31-SW32) is connected 'in parallel' to the stack of capacitors C1-C4 (i.e., the two terminals of each pair of switches SW11-SW12, SW21-SW22, SW31-SW32 are respectively connected to the two terminals of the stack of capacitors C1-C4). The three inter-capacitor junctions are connected to the three inter-switch junctions of the three pairs of switches SW11-SW12, SW21-SW22, SW31-SW32 through three coils L1, L2 and L3, respectively.

A control and generation circuit (not represented in FIG. 2) generates PWM control signals with fixed duty cycles to control the switches SW11-SW12, SW21-SW22, SW31-SW32. The values of the duty cycles for controlling SW11-SW12, SW21-SW22, SW31-SW32 are as follows:

DC11=75%, DC12=25%
DC21=50%, DC22=50%
DC31=25%, DC32=75% so as to set the voltages of the junction nodes between C1 and C2, between C2 and C3 and between C3 and C4 to 75%. u_total, 50%. u_total and 25%. u_total, respectively, after balancing.

Figure 3A:
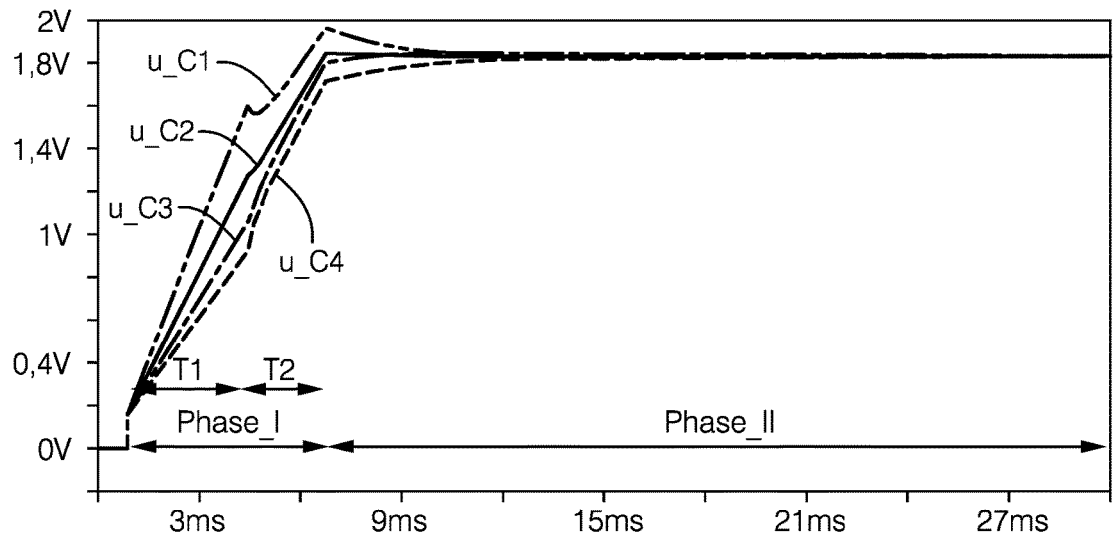
FIG. 3A shows simulation results of the capacitor voltages converging when charging and balancing the backup power supply system of FIG. 2.

FIG. 3A shows a simulation result of the evolution over time of the capacitor voltages u_C1, u_C2, u_C3, u_C4 of the four capacitors C1, C2, C3 and C4 when these capacitors are charged from the power source 200, through the balancing circuit 20. For the simulation, the voltage u_total of the power source 200 is for example set to 7.2V. Consequently, a target value of the capacitor voltage for each of the capacitors C1, C2, C3 and C4 is equal to 1.8V (7.2V divided by 4).

Initially, the capacitor voltages u_C1, u_C2, u_C3, u_C4 are for example equal or close to zero. The time evolutions of the different capacitor voltages u_C1, u_C2, u_C3, u_C4 are analogous, but not identical as the capacitors have different capacitance values.

The charging operation has two main phases: a first quick phase I and a second slow phase II. The first quick charging phase I has a first (or initial) part T1 during which there is no balancing. The capacitor voltages u_C1, u_C2, u_C3, u_C4 start increasing but diverge, which means that they become more and more different from one another, due to the lack of balancing. This phenomenon is due to the fact that the balancing circuit 20 needs that a certain amount of voltage be reached, for example a voltage threshold of around 3 or 4 V at the terminals of the stack of the N serial capacitors, in order for the switches to start working. However, depending on the technology used for the switches, the latter may work before reaching this N-capacitor voltage threshold.

As soon as the balancing starts, the capacitor voltages u_C1, u_C2, u_C3, u_C4 converge, which means that they come closer to each other. This corresponds to a second and subsequent part T2 of the quick charging phase I. Then, as soon as the maximum total voltage u_total across the capacitor stack is reached (7.2V in the present example), the slow phase II starts. During the slow phase II, the capacitor voltages u_C1, u_C2, u_C3, u_C4 across the different capacitors increase more slowly or decrease a little and converge to a common voltage. As can also be seen in FIG. 3A, the capacitor voltages u_C1, u_C2, u_C3, u_C4 of all capacitors C1 to C4 reach and keep a value equal or very close to the target value of 1.8V after a short time period of around 15 ms.

In the exemplary embodiment of FIG. 3A, during the first phase I of charging, the power source 200 produces a fixed charge current. During the second phase II of charging, after the voltage of the N stacked capacitors has reached the predetermined target value (u_total), the power source 200 produces a charge current that is modulated or regulated in order to maintain the voltage of the N stacked capacitors at the predetermined target value (u_total).

Figure 3B:
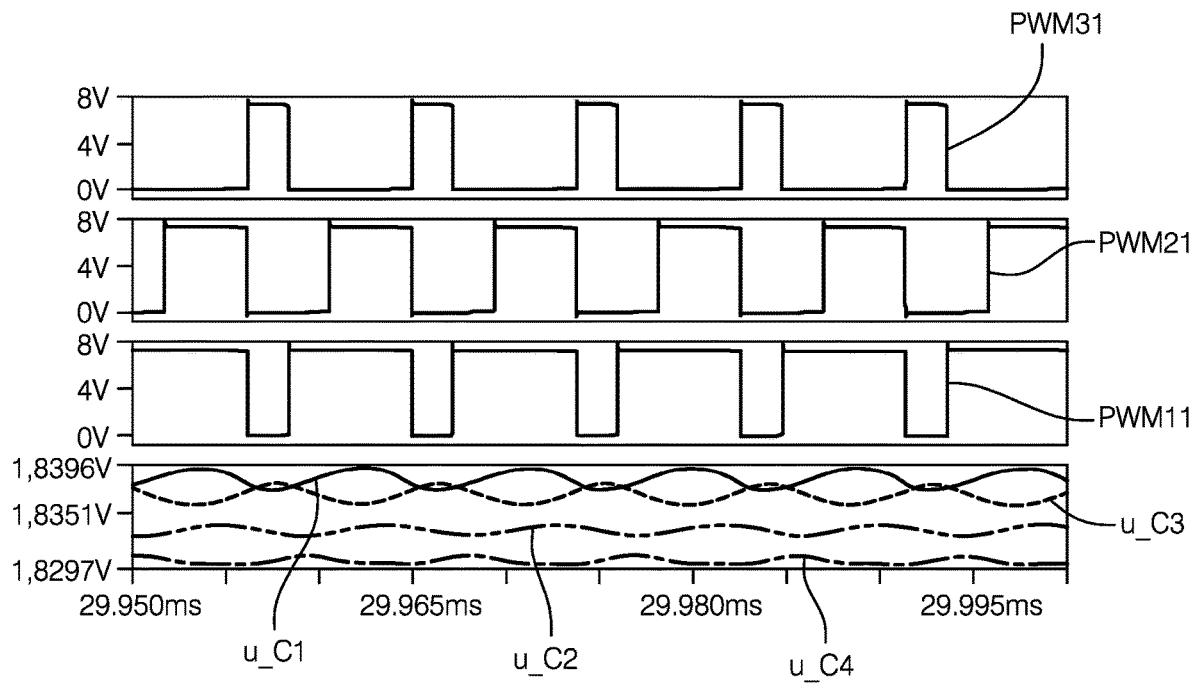
FIG. 3B shows PWM control signals transmitted to switches of the backup power supply system in the simulation of FIG. 3A and the capacitor voltages, after convergence (between 29.950 ms and 30 ms after start of the balancing operation).

FIG. 3B shows the PWM control signals PWM11, PWM21 and PWM31, transmitted to switches SW11, SW21 and SW31 respectively, and the time evolutions of the capacitor voltages u_C1, u_C2, u_C3, u_C4, during a time period between 29,950 ms and 30 ms (from the beginning of the charging operation). FIG. 3B shows that, after a period of time of around 30 ms from the start of the charging operation, all capacitor voltages u_C1, u_C2, u_C3, u_C4 have reached and maintain voltage value equal to the capacitor voltage target value (1.8V) with an accuracy of around 2 or 3%.

The balancing circuit 20 allows that each of the N stacked capacitors reaches the target voltage value in a fast, accurate and efficient manner.

Figure 4:
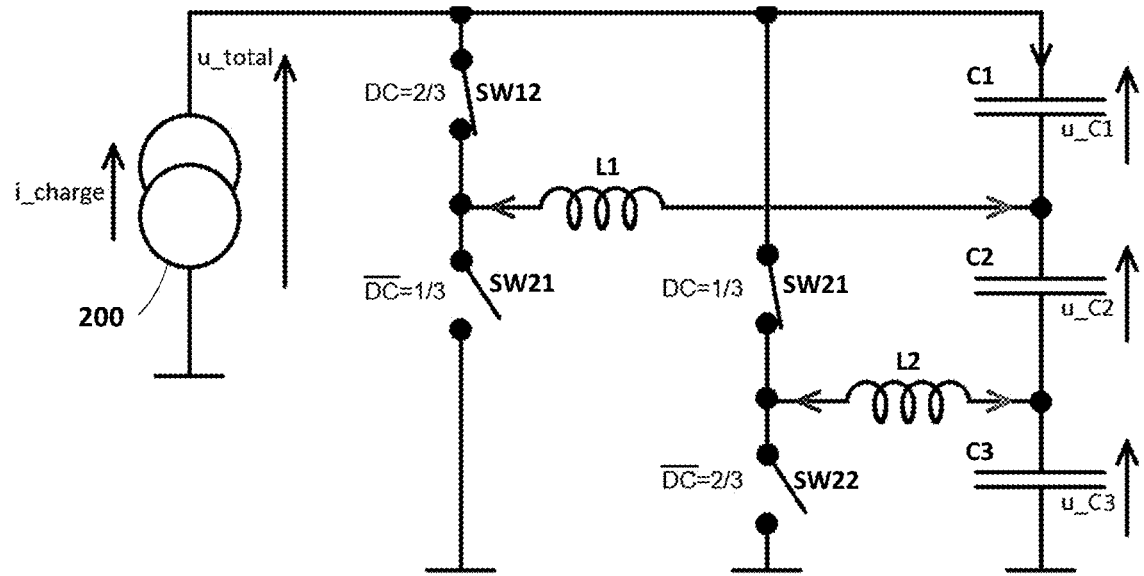
FIG. 4 shows a third exemplary embodiment of the backup power supply system, having three capacitors and two pairs of associated switches.

FIG. 4 shows a third exemplary embodiment that only differs from the second exemplary embodiment in that the stack of capacitors has only three serially connected capacitors C1, C2, C3 and two pairs of associated switches SW11-SW12 and SW21-SW22. The inter-switch junctions are connected to the two inter-capacitor junctions through two coils L1, L2, respectively.

In some exemplary embodiments (such as the second and third exemplary embodiments), each pair of associated switches is connected 'in parallel' to a stack of N serially connected capacitors (i.e., the two terminals of each pair of switches are connected to the two terminals of the N stacked capacitors, respectively). For each balancing unit BUj, the inter-switch junction between SWj1 and SWj2 is connected to an inter-capacitor junction between two capacitors of respective indices i and i+1 of the same group j through the coil Lj, and the control and generation circuit 20 generates a first PWMj1 control signal having a duty cycle equal to (N−i)/N and a second PWMj2 control signal having a duty cycle equal to i/N.

In other exemplary embodiments (that are a variant of the above embodiments), for each balancing unit BUj associated with the group j of at least two capacitors, the pair of associated switches SWj1-SWj2 is connected in parallel to the group j of stacked capacitors. When n groups of at least two consecutive capacitors are defined from the N capacitors, n pairs of associated switches are connected 'in parallel' the n groups of capacitors, respectively. In addition, for each balancing unit BUj associated with the group j of at least two capacitors, the inter-switch junction between SWj1 and SWj2 is connected to an inter-capacitor junction between two capacitors of respective indices i and i+1 of the group j through a coil Lj. In these variant embodiments, the control and generation circuit generates PWM control signals that all have a fixed duty cycle of 50% for all the switches SWj1-SWj2 with 1≤j≤n.

Figure 5:
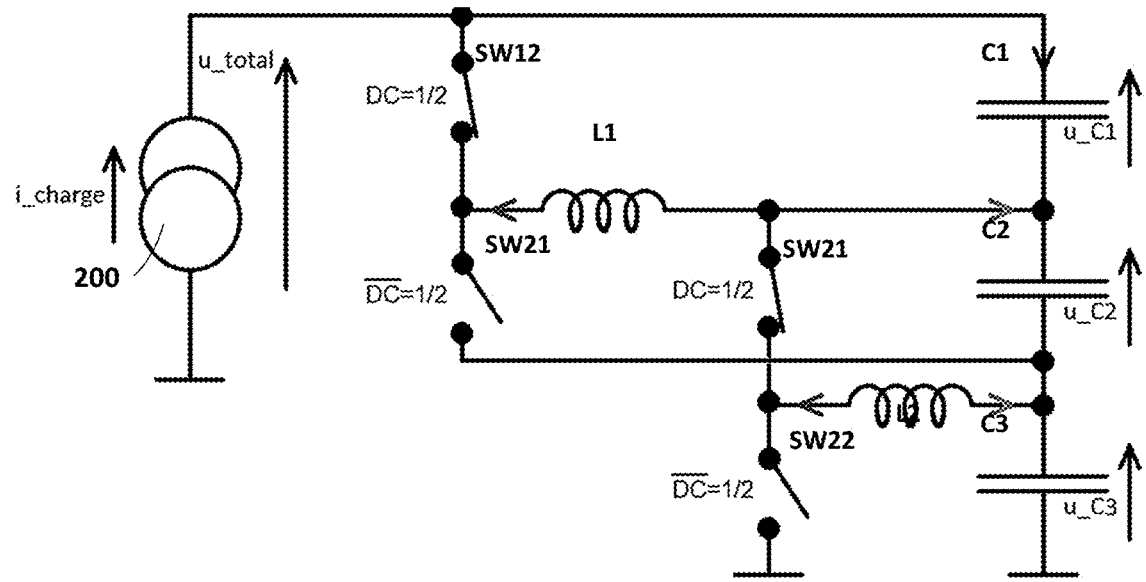
FIG. 5 shows a fourth exemplary embodiment of the backup power supply system, having three capacitors and two pairs of associated switches, that is an alternative embodiment to embodiment of FIG. 4.

FIG. 5 is a fourth exemplary embodiment, according to the above disclosed variant. More precisely, the embodiment of FIG. 5 is a variant of the embodiment of FIG. 4 according to the above paragraph. In this FIG. 5, the stack of capacitors has three serially connected capacitors C1, C2, C3 and two pairs of associated switches SW11-SW12 and SW21-SW22 balances the capacitor voltages. More precisely, the pair of switches SW11-SW12 is connected 'in parallel' to the two capacitors C1, C2 (i.e., the two terminals of the pair of switches SW11-SW12 are connected to the two terminals of the capacitors C1-C2) and the pair of switches SW21-SW22 is connected 'in parallel' to the two capacitors C2, C3 (i.e., the two terminals of the pair of switches SW21-SW22 are connected to the two terminals of the capacitors C2-C3). The inter-switch junctions are connected to the inter-capacitor junctions through the coils L1 and L2. The duty cycles of all PWM control signals transmitted to switches SW11-SW12 and SW21-SW22 are fixed and equal to 50%.

Figure 6:
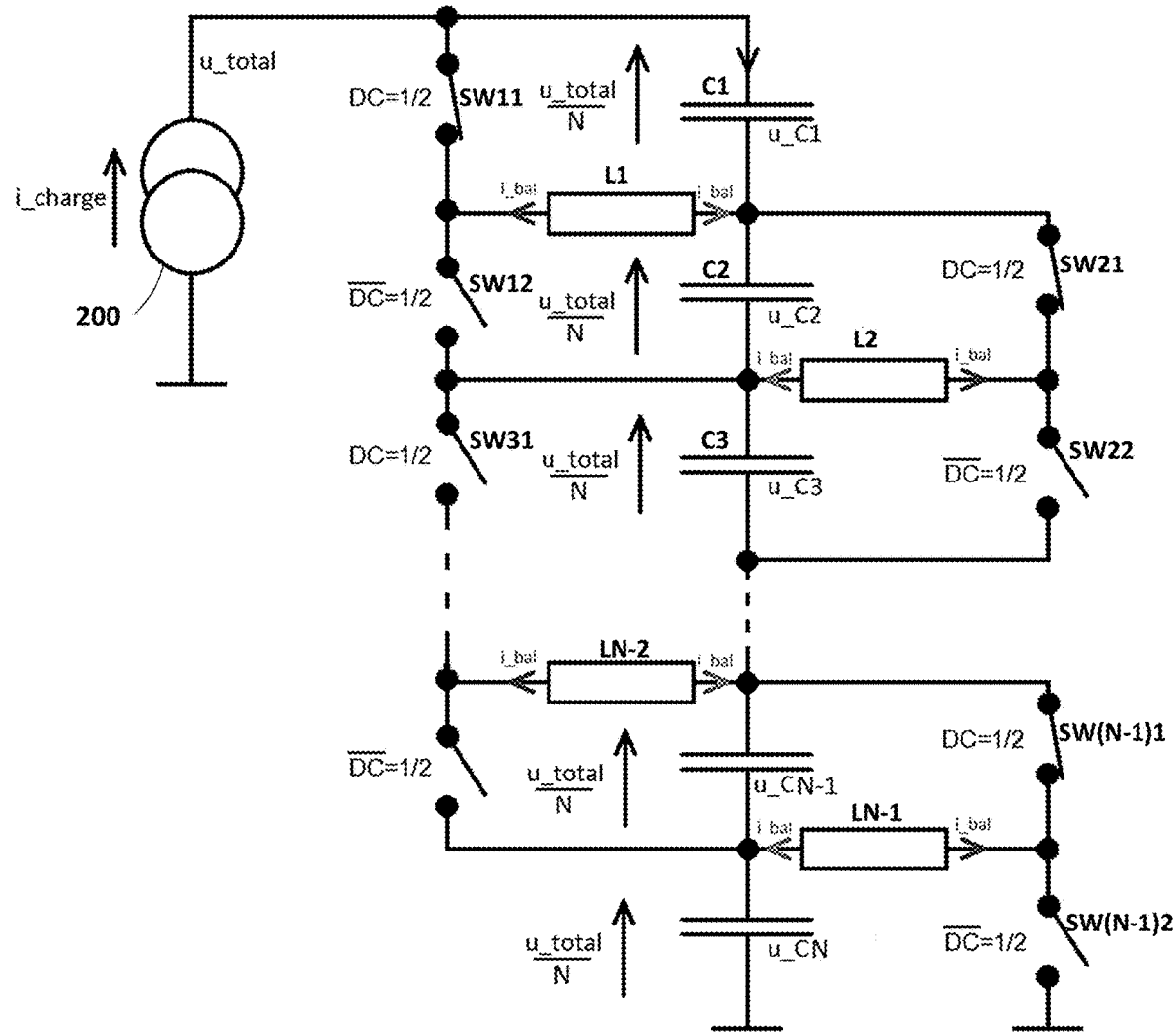
FIG. 6 shows a fifth exemplary embodiment of the backup power supply system, having N capacitors and N−1 pairs of associated switches, N being an odd number.

FIG. 6 shows a fifth exemplary embodiment that is a generalization of the fourth embodiment of FIG. 5, with a number N of serially connected (stacked) capacitors, N being an odd number. For each balancing unit BUj, the pair of associated switches SWj1-SWj2 is connected 'in parallel' to the corresponding group of two capacitors (i.e., the two terminals of switches SWj1-SWj2 are connected to the two terminals of the corresponding group of two capacitors) and the inter-switch junction is connected to the inter-capacitor junction through a coil Lj. There are N−1 coils that connect each of the N−1 inter-capacitor junctions to N−1 inter-switch junctions belonging to the N−1 pairs of associated switches SWj1-SWj2 with 1≤j≤N−1, respectively.

Figure 7:
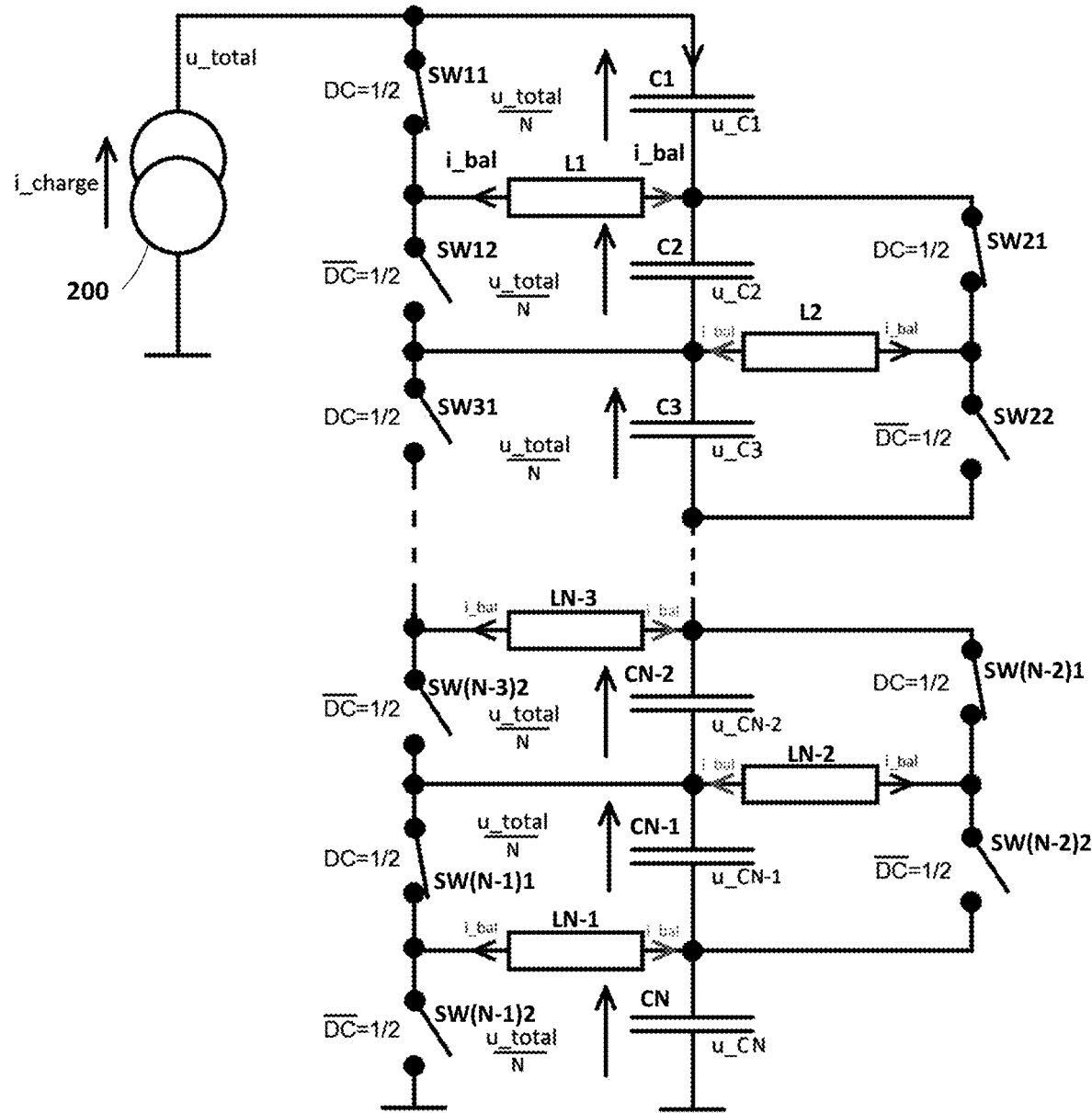
FIG. 7 shows a sixth embodiment of the backup power supply system, having N capacitors and N−1 pairs of associated switches, N being an even number.

FIG. 7 shows a sixth embodiment that only differs from the sixth embodiment in that the number N of serially connected (stacked) capacitors is an even number.

Figure 8:
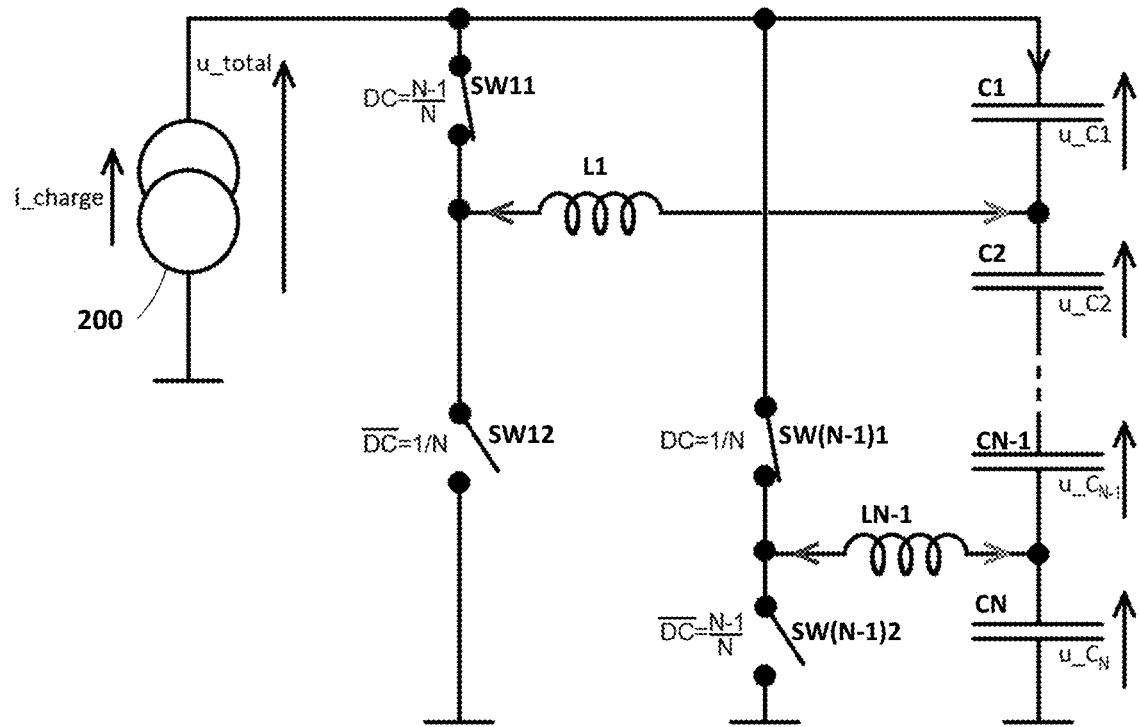
FIG. 8 shows a seventh exemplary embodiment of the backup power supply system, having N capacitors and N−1 pairs of associated switches (only a part the N capacitors and N−1 pairs of switches being represented for the sake of clarity), during charging of the capacitors from a power source.

FIG. 8 shows a seventh exemplary embodiment that is a generalization of the embodiments of FIGS. 2 and 4, with a number N of serially connected (stacked) capacitors. The N serially connected capacitors have respective indices i from 1 to N. The capacitor C1 is connected to the positive terminal of the power source 200 and the capacitor CN is connected to the negative terminal of the power source 200 (here to the ground). For each balancing unit BUj, the pair of associated switches SWj1-SWj2 is connected 'in parallel' to the N serially connected (stacked) capacitors (i.e., the two terminals of the pair of associated switches SWj1-SWj2 are connected to the two terminals of the N stacked capacitors) and the inter-switch junction between SWj1 and SWj2 is connected to an inter-capacitor junction through a coil Lj. When the inter-capacitor junction between capacitors Ci and Ci+1 are connected to the inter-switch junction between SWj1 and SWj2, a first PWM control signal having a duty cycle equal to (N−i)/N is generated and transmitted to a first of the two associated switches SWj1 and a second PWM control signal having a duty cycle equal to i/N is transmitted to the second of the two associated switches SWj2. The first switch SWj1 is connected to the positive terminal of the power source 200 and the second switch SWj2 is connected to the negative terminal of the power source 200 (here connected to the ground).

Figure 9:
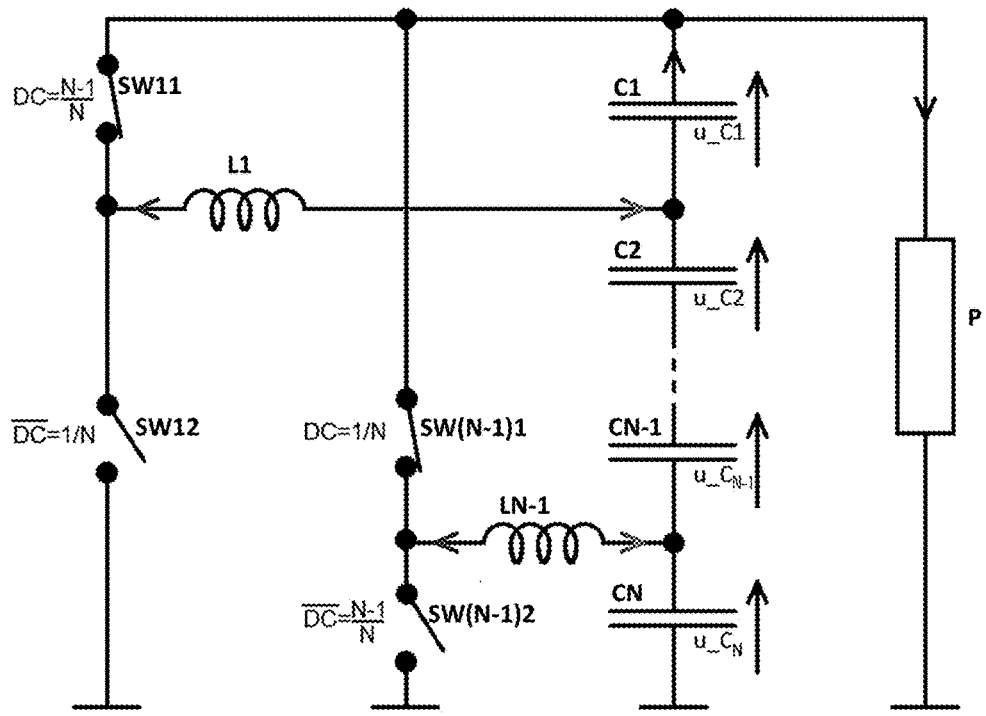
FIG. 9 shows the seventh exemplary embodiment of the backup power supply system of FIG. 8, during discharging of the capacitors to supply a load (or device).
Figure 10:
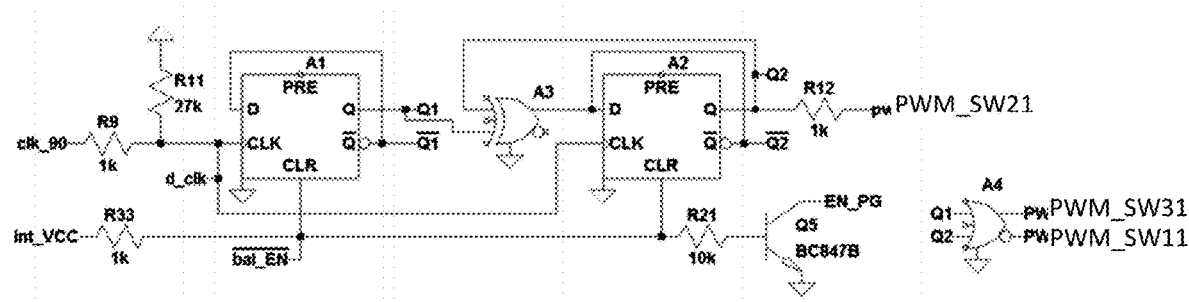
FIG. 10 shows an exemplary embodiment of a circuit for generating PWM control signals controlling the switches of the backup power supply system of FIG. 2.

FIG. 9 shows the backup power supply system according to the seventh embodiment of FIG. 8, during discharging of the N capacitors in order to supply a load P. The connection of the stack of N capacitors to the power source is interrupted and the capacitors discharge into the load. The balancing circuit allows to balance the respective voltages of the N capacitors during discharging of the N capacitors.

In an eighth exemplary embodiment of the backup power supply system, n groups of two or more capacitors are defined from the N capacitors and at least part of the n groups have more than two capacitors. Such embodiment is appropriate when the number N of capacitors is important.

According to the present disclosure, the control and generation circuit generates PWM control signals having fixed duty cycles, which allows to balance quickly the capacitor voltages of the N serially connected capacitors without feedback loop.

In some exemplary embodiments, each pair of associated switches are connected 'in parallel' to the N serially connected capacitors. In other exemplary embodiments, j pairs of associated switches are connected 'in parallel' to j groups of at least two capacitors.

The generation of these PWM control signals having fixed duty cycles can be achieved using flip-flops and logical gates. The control and generation circuit uses a clock signal that is transmitted from the power source. The flip-flops operate as frequency dividers. A number of x flip-flops allows to generate the duty-cycles of a maximum of $2^x$ capacitors connected in series. More generally, the control and generation circuit 30 has a number of n flip-flops, wherein n is determined from the number N of capacitors according to the relation $2^{n-1} < N \leq 2^n$.

Figure 11:
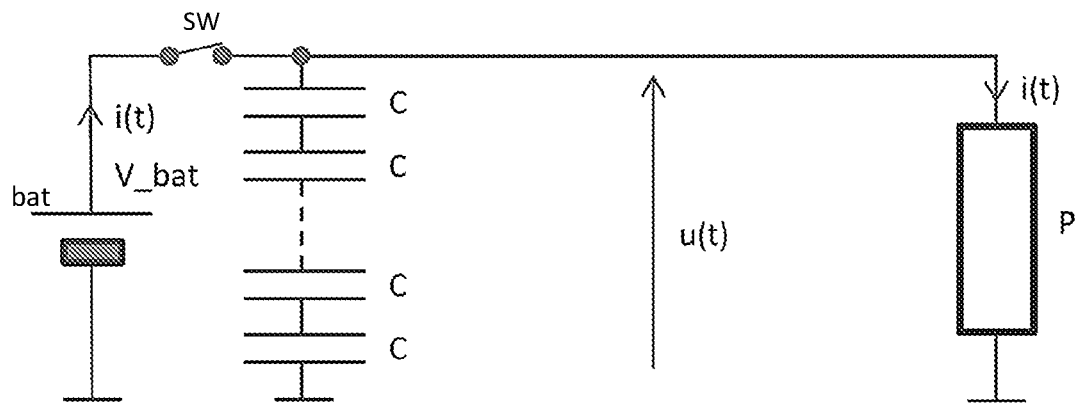
FIG. 11 shows an exemplary embodiment of a power supply system of the prior art, having a power source connected in parallel to a plurality of serially connected capacitors for buffering energy, supplying a load P.
Figure 12:
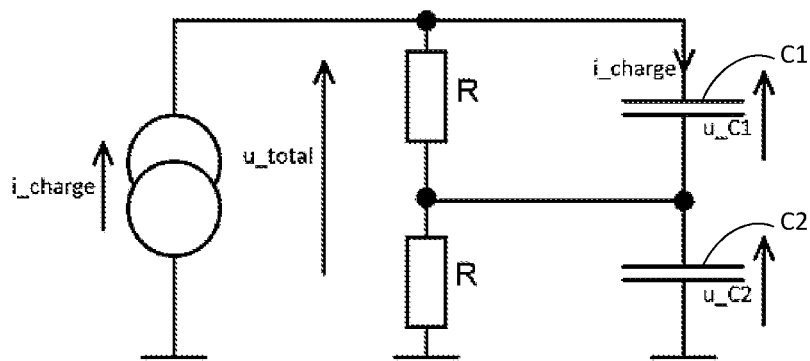
FIG. 12 shows a first exemplary embodiment of a balancing circuit for capacitors of a power supply system, of the prior art.
Figure 13:
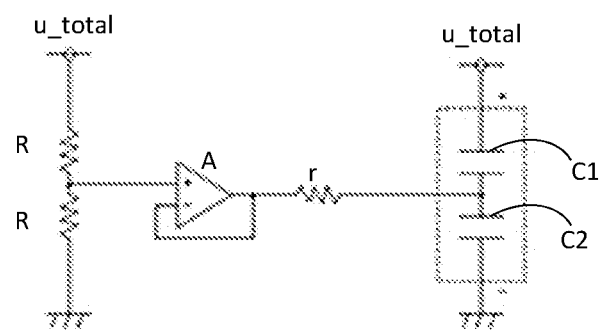
FIG. 13 shows a second exemplary embodiment of a balancing circuit for capacitors of a power supply system, of the prior art, that is an improved variant of the first exemplary embodiment of FIG. 12.
Figure 14:
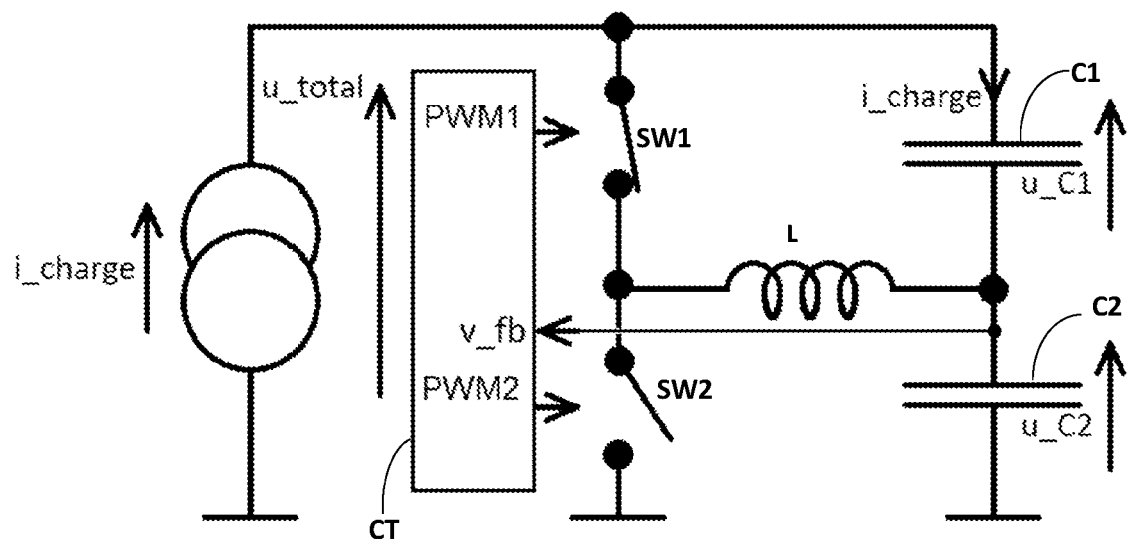
FIG. 14 shows a third exemplary embodiment of an improved balancing circuit for capacitors of a power supply system, of the prior art.

FIG. 11 shows an exemplary embodiment of a circuit for generating three PWM control signals having respective duty cycles of 25%, 50% and 75%. Such a circuit is well-known by the skilled person and will not be described in more detail.

The generation of PWM control signals having one common duty cycle of 50% allows to use a control and generation circuit that is simple, has smaller components and produces less current ripple.

The reduction of the current ripple is noticeable in particular when the basis frequency, used to control the switches and balance the capacitors, is provided by the power source 200. For example, for a stack of four capacitors C1 to C4, a plurality of PWM control signals having respective duty-cycles of 25%, 50% and 75% are generated, which implies to divide the basis frequency by four in order to obtain the switching (or balancing) frequency. The generation of PWM control signals produces a higher current ripple for a lower frequency. The generation of PWM control signals having only a 50% duty-cycle only needs to divide the basis frequency by two. Therefore, through the higher switching frequency (basis frequency divided by two) of the balancing circuit, less current ripple is produced. When an external basis frequency generator is used and its frequency is determined according to the desired switching frequency for balancing the capacitors, there is no noticeable difference of current ripple.

As previously indicated, the backup power supply system 100 is for example integrated in a vehicle and supplies power to an electrical circuit of the vehicle. In such a case, the power source 200 is an electrical battery of the vehicle, such as a 12V battery. The N serially connected capacitors supply power to the electrical circuit of the vehicle when the electrical battery of the vehicle is temporary disconnected from the electrical circuit.

The present disclosure also concerns the balancing circuit 20 for balancing respective voltages of N serially connected capacitors of a backup power supply system, during charging or discharging of said N capacitors, n groups of at least two consecutive capacitors, with n≤N−1, being defined from the N capacitors, as previously described.

In particular, the balancing circuit 20 has, for each group of capacitors, a pair of associated and connected switches with an inter-switch junction that is connected to an inter-capacitor junction of said group of capacitors through an electromagnetic coil, said group of capacitors, said pair of associated switches and said electromagnetic coil forming a balancing unit; and a control and generation circuit for generating PWM control signals and transmitting a generated PWM control signal to each of the switches, that generates PWM control signals having fixed duty cycles.

The duty cycles of two PWM control signals transmitted to two associated switches are complementary for each balancing unit.

The present disclosure also concerns a vehicle integrating the backup power supply system and/or the balancing circuit previously described.

The preceding description is illustrative rather than limiting in nature. Variations and modifications to the disclosed example embodiments may become apparent to those skilled in the art that do not necessarily depart from the essence of the invention. The scope of legal protection given to the invention can only be determined based on the following claims.

We claim:
1. A backup power supply system, comprising:
a stack of N consecutively connected capacitors grouped in y groups each including at least two consecutive capacitors, wherein y<N−1; and
a balancing system for balancing respective voltages of the N consecutively connected capacitors during charging or discharging of said N consecutively connected capacitors, said balancing system comprising:
a plurality of balancing units for the y groups of capacitors, respectively, each balancing unit comprising a pair of associated switches connected through an inter-switch junction and an electromagnetic coil, said inter-switch junction being connected to an inter-capacitor junction of the corresponding group of capacitors through said electromagnetic coil; and
a control and generation circuit for generating PWM control signals and transmitting a generated PWM control signal to each of the switches;
wherein:
the control and generation circuit is configured to generate PWM control signals having fixed duty cycles that do not vary temporarily during charging or discharging of the N consecutively connected capacitors,
the duty cycles of two PWM control signals to be transmitted to two associated switches are complementary for each balancing unit,
the control and generation circuit includes a plurality of n flip-flops, and
n is an integer determined from the number N of capacitors according to the relation $2^{n-1} < N \leq 2^n$.

2. The backup power supply system according to claim 1, wherein the stack of N consecutively connected capacitors has two terminals and each pair of associated switches is connected to said terminals of the stack of N consecutively connected capacitors.

3. The backup power supply system according to claim 2, wherein
the N consecutively connected capacitors have respective indices i,
i is from 1 to N, and
for each balancing unit having an inter-capacitor junction between two capacitors of respective indices i and i+1 connected to the inter-switch junction, the control and generation circuit is configured to generate a first PWM control signal having a duty cycle equal to (N−i)/N and a second PWM control signal having a duty cycle equal to i/N.

4. The backup power supply system according to claim 1, wherein, for each balancing unit, the pair of associated switches is connected to two terminals of the corresponding group of capacitors.

5. The backup power supply system according to claim 4, wherein the control and generation circuit is configured to generate PWM control signals that all have a duty cycle of 50%.

6. The backup power supply system according to claim 1, wherein each group of capacitors includes only two capacitors.

7. The backup power supply system according to claim 1, wherein the control and generation circuit includes a flip-flop based frequency divider.

8. The backup power supply system according to claim 7, wherein the control and generation circuit is configured to be connected to a power source and be provided with a clock signal from said power source.

9. The backup power supply system according to claim 1, wherein the control and generation circuit includes logical gates.

10. The backup power supply system according to claim 1, comprising a power source that is configured to:
produce a fixed charge current, during a first charging phase; and
during a second charging phase, after the voltage of the stack of N consecutively connected capacitors has reached a predetermined target value, produce a charge current modulated to maintain the voltage of the stack of N consecutively connected capacitors at the predetermined target value.

11. The backup power supply system according to claim 1, wherein the stack of N consecutively connected capacitors are configured to supply power to an electrical circuit of a vehicle when an electrical battery of the vehicle is temporarily disconnected from the electrical circuit.

12. A vehicle comprising the backup power supply system according to claim 1, wherein the backup power supply system is configured to be charged from a power source comprising an electrical battery of the vehicle and to supply power to an electrical circuit of the vehicle.

\* \* \* \* \*